United States Patent [19]
Yang

[11] Patent Number: 5,640,410
[45] Date of Patent: Jun. 17, 1997

[54] SEMICONDUCTOR LASER DIODE

[75] Inventor: Seung-kee Yang, Seoul, Rep. of Korea

[73] Assignee: Samsung Electronics Co., Ltd., Kyungki-do, Rep. of Korea

[21] Appl. No.: 535,933

[22] Filed: Sep. 28, 1995

Related U.S. Application Data

[62] Division of Ser. No. 359,657, Dec. 20, 1994.

[30] Foreign Application Priority Data

Aug. 27, 1994 [KR] Rep. of Korea ............... 94-21306

[51] Int. Cl.$^6$ .................................................. H01S 3/19
[52] U.S. Cl. ........................................ 372/46; 372/45
[58] Field of Search .................................. 372/44, 45, 46

[56] References Cited

U.S. PATENT DOCUMENTS

| | | | |
|---|---|---|---|
| 5,381,434 | 1/1995 | Bhat et al. | 372/45 |
| 5,432,810 | 7/1995 | Nakayama | 372/46 |

Primary Examiner—James W. Davie
Attorney, Agent, or Firm—Rothwell, Figg, Ernst & Kurz, P.C.

[57] ABSTRACT

A self-align structured laser diode and manufacturing method including the steps of forming a multiple epitaxy layer including an activation layer on a semiconductor substrate; forming a rectangular ridge on a top surface of the multiple epitaxy layer; depositing a passivation layer having a predetermined thickness on the multiple epitaxy layer having the ridge; depositing a photoresist on the passivation layer; exposing the entire photoresist on the top surface of the ridge or the portion of the entire photoresist overlapping the top surface of the ridge and the upper portion of the photoresist deposited on the side surface of the ridge perpendicular to the top surface of the ridge to a predetermined depth; removing the exposed portion of the photoresist; removing the exposed passivation layer; removing the photoresist that remains in both sides of the ridge; and forming a current injection layer in the top surface of the resultant structure.

4 Claims, 16 Drawing Sheets

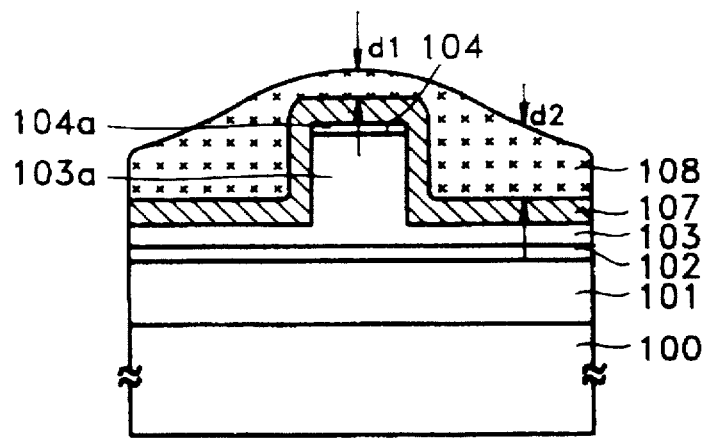
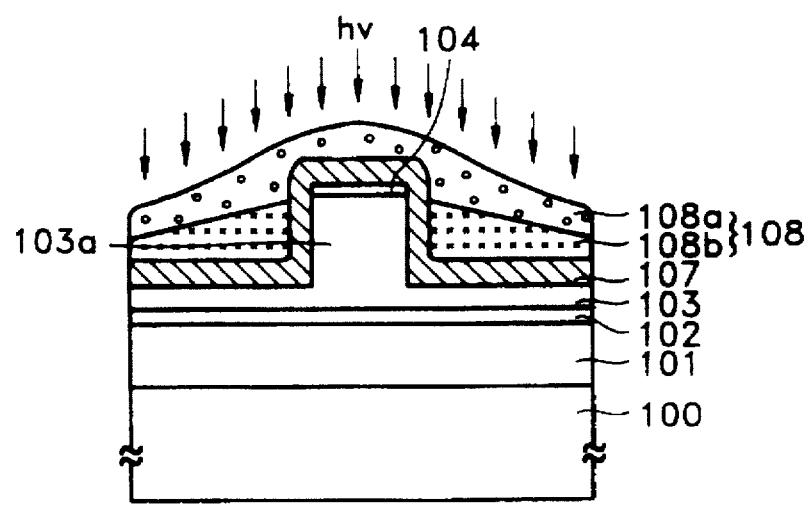
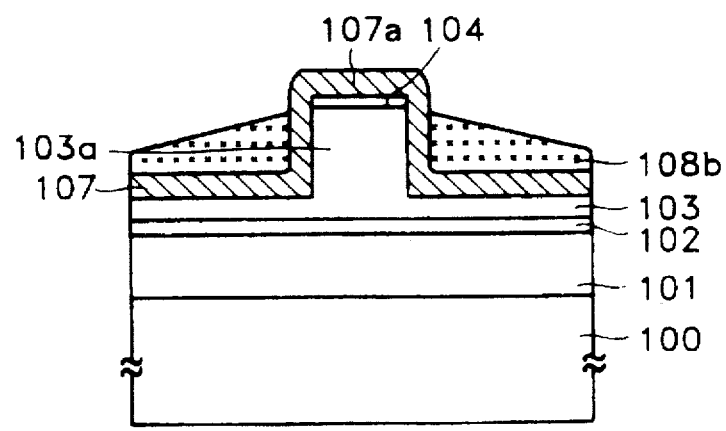

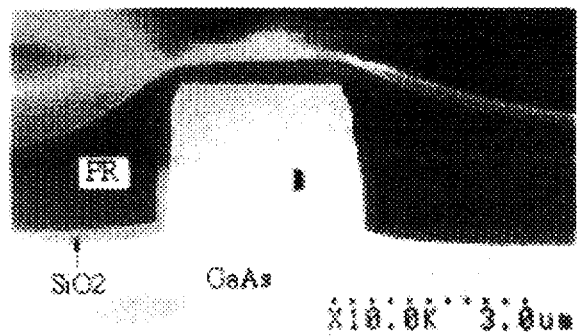 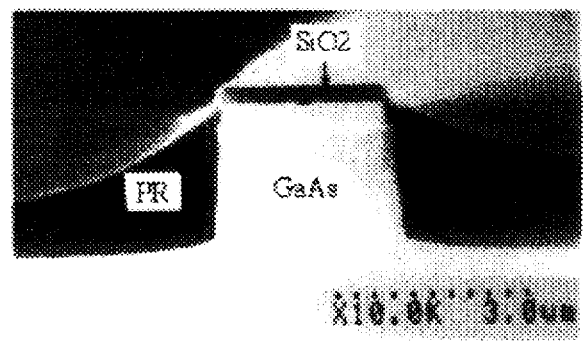
FIG.7A  FIG.7B
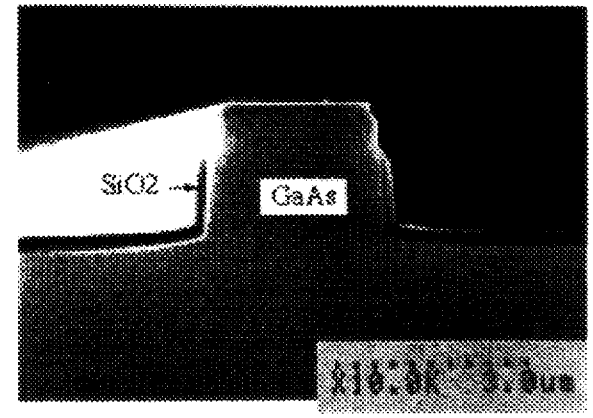
FIG.7F

SEMICONDUCTOR LASER DIODE

This is a divisional of application Ser. No. 08/359,657, filed Dec. 20, 1994.

BACKGROUND OF THE INVENTION

The present invention relates to a semiconductor laser diode and manufacturing method therefor, and more particularly, to a ridge-type semiconductor laser diode having an improved ohmic contact surface and a manufacturing method therefor.

Recently, as the commercial availability increases for such laser devices for use in data processing systems and optical communication and other laser diode applications (e.g., laser printers and bar-code readers), there have been great improvements in the structure and manufacturing method of the laser diode as a light source. Specifically, many studies are underway for the ridge-type laser diode whose upper portion has a rectangular protrusion can be operated with a low threshold current. However, due to several reasons, the conventional ridge-type laser diode still has several problems in spite of the continuous study.

FIG. 1 is a section view showing the layers of a conventional ridge-type semiconductor laser diode. Referring to FIG. 1, the ridge-type laser diode is structured such that a first cladding layer 2, a first waveguide layer 3, an activation layer 4, a second waveguide layer 5, a second cladding layer 6, a cap layer 7, a passivation layer 8 and a current injection layer 9 are sequentially deposited on the ridge-type semiconductor substrate 1. Specifically, a rectangular ridge is formed in the center of the upper portion of second cladding layer 6. In addition, cap layer 7 is formed on the top surface of the ridge, passivation layer 8 covers areas excluding a portion of the top surface of the ridge, and current injection layer 9 resistively contacts cap layer 7 via an opening in passivation layer 8.

The operation of the laser diode can be explained as follows. First, when a voltage is applied to current injection layer 9, electrons are injected into the ridge through an ohmic contact surface 10 between the current injection layer 9 and cap layer 7. The electrons are coupled with the (electron) holes in activation layer 4, to thereby generate primary light which causes another recombination thereof. Thus, lights having the same frequencies are successively generated. The generated light is, while guided between first and second waveguide layers 3 and 5, resonates between mirrors provided at the front and rear surfaces of the diode and thus oscillates as a laser.

A process for manufacturing such device is shown in FIG. 3A to FIG. 3F in sequence. Epitaxy layers such as first cladding layer 2, first waveguide layer 3, activation layer 4, second waveguide layer 5, second cladding layer 6 and cap layer 7 are sequentially grown on semiconductor substrate 1 (FIG. 3A). The growth process can be performed by various deposition methods such as metal organic chemical vapor deposition (MOCVD), plasma-enhanced chemical vapor deposition (PECVD) and molecular beam epitaxy (MBE). Then, on the second cladding layer 6, a silicon oxide ($SiO_2$) mask layer is formed by employing a conventional patterning technique (FIG. 3B). Then, the second cladding layer is etched by employing a reactive ion etching (RIE) method so as to form a ridge (FIG. 3C). Then, the $SiO_2$ mask is removed (FIG. 3D), and a passivation layer is deposited on the whole surface of the ridge structure (FIG. 3E). Here, the middle portion of the passive layer overlapped with the top end surface of ridge is etched by a patterning method to expose the epitaxy layers. Finally, an ohmic surface and a current injection layer are sequentially formed on the exposed surface of the ridge (FIG. 3F).

Such a conventional manufacturing method is apt to cause a misalignment of the passivation layer to the ridge. Therefore, a micro-aligning process is required when patterning for making the ohmic contact surface. Since, the ridge width is 2 to 3 μm, and the actual width of the ohmic contact is approximately 1 to 2 μm, an extremely precise aligning method is required, which often results in some deviation from the ridge and skewed etching.

FIG. 2 is a section view showing a laser diode where such misalignment has been generated in a manufacturing process. As shown in FIG. 2, when the opening of passivation layer 8 deviates from the top surface of the ridge, a current is injected from the side surface thereof instead of the top, which is fatal to the proper function on operation thereof. Further, there are other problems in the structure in that sheet resistance between layer 9 and ridge 3 is great due to the narrow ohmic contact therebetween via ohmic contact layer 7, and upon operation, the heat generated via the ohmic contact cannot be effectively transferred through ohmic contact layer 7 since the heat transfer of the laser diode performs mainly through the top rather than the side of the ridge. Therefore, it is important that the ohmic contact layer functions as a heat transfer medium. However, with the narrow ohmic contact surface area as above, the inefficient heat emission has a negative and often catastrophic influence on the life and operation stability of the device.

To solve the problems of misalignment, various self-aligning methods have been under study.

FIG. 4A to FIG. 4F illustrate a manufacturing process of a laser diode in which the ohmic contact surface is generated by a self-align method (Japanese laid-open Patent Publication No. 4-162689).

A first cladding layer 12, an activation layer 13, a second cladding layer 14, and a cap layer 15 are grown on a semiconductor substrate 11 having a ridge 11a with a planar top surface formed in the upper surface thereof (FIG. 4A). Then, a photoresist 3 having a high viscosity and a planar surface is deposited on the resultant structure (FIG. 4B), which is then etched by an oxygen plasma method to expose the top of ridge 15a (FIG. 4C). Then, the exposed upper portion of ridge 15a is removed by employing a solution of ammonia and hydrogen peroxide, which planarizes the upper surface of cap layer 15 (FIG. 4D). Then, a titanium film 2, i.e., a mask layer, is deposited on the upper surface of photoresist 3 and on the center of the exposed surface of cap layer 15 corresponding to the aperture in photoresist 3 (FIG. 4E). Next, the remainder of photoresist 3 (on both sides of ridge 15a) and titanium film 2 on photoresist 3 are removed together by employing a lift-off method. Thereafter, a proton injection (4) is performed over the entire substrate so as to form a high resistance region 5 on both sides of the remainder of titan film 2, to thereby complete the formation of the device (FIG. 4F).

The above-described method employs a self-alignment process which exposes the ohmic contact area via the opening portion of photoresist 3 without the need for micro-aligning. Thus, misalignment is not generated and the manufacturing process can be performed with precision. However, the process for forming a high resistance region is performed by complicated processes such as removing (planarizing) ridge 15a, depositing a titanium film and injecting protons. In addition, the heat emissive area of the device is limited to the two-dimensional top surface of the ridge. Therefore, the heat emission is not so efficient.

FIG. 5A to FIG. 5G illustrate a manufacturing method employing the self-align method disclosed in U.S. Pat. No. 5,208,183.

Referring to FIG. 5G, a gallium arsenide (GaAs) buffer layer 122, a first GaAlAs cladding layer 123, and a sandwich-structured (activation layer and waveguide layer) layer 124 are deposited on an n⁺ GaAs substrate 121 whose bottom surface is provided with a metal (Au/Sn/Au) electrode 120. Then, a second GaAlAs cladding layer 125 whose upper surface is provided with a ridge, an $SiO_2$ passivation layer 163 that covers the surface of second GaAlAs cladding layer 125 excluding the top surface of ridge 125a, a planarization layer 127, a metal (AuBe/Ti/Au) electrode 128, a p-GaAs layer 129 and a GaAs cap layer 130 are formed.

The manufacturing method of the above structure is as follows.

As shown in FIG. 5A, GaAs buffer layer 122, first GaAlAs cladding layer 123, the sandwich layer 124 with a activation layer and waveguide layer, and second GaAlAs cladding layer 125 are formed on a semiconductor substrate 121. Then, a mask 62 made of metal or a resist material is formed on the resultant structure.

As shown in FIG. 5B, the portion exposed on both sides of mask 62 is etched to a predetermined depth, and a ridge 125a is formed in second GaAlAs cladding layer 125.

As shown in FIG. 5C, a passivation layer 63 is deposited over the entire surface of the resultant structure.

As shown in FIG. 5D, a planarization layer 127 of polyimide is formed over the resultant structure.

As shown in FIG. 5E, the surface of planarization layer 127 is etched to a predetermined depth by the RIE method using an oxygen plasma, and passivation layer 63 formed in the top surface of ridge 125a is partially exposed.

As shown in FIG. 5F, the portion of passivation layer 63 which is exposed via the aperture of planarization layer 127 is etched, to thereby expose the surface of mask 62.

As shown in FIG. 5G, metal electrode layer 128 is deposited on mask 62, and the desired laser diode is obtained.

It is noticeable that the above-described manufacturing method can generate an ohmic contact surface by a self-alignment method without using any micro-aligning process, and is performed by a process which is more simple than that of the technique disclosed in the aforementioned Japanese laid-open publication. Such a laser diode obtained by the method, however, has several problems. For example, in the finally obtained structure, planarization layer 127 on both sides of the ridge serves as a thermal resistor and thus suppresses heat emission through both sides of the ridge upon operation. Thus, function degradation due to an inefficient heat transfer and emission and a heat concentration of the device is inevitable. Specifically, when a planarization layer is formed by polyimide, which is represented as an embodiment of the above method, degradation of the device caused by a thermal concentration becomes more serious due to the low thermal conductivity of the polyimide.

Another problem caused by including the planarization layer in the final structure is that a flexible material (polyimide) has to be employed for the planarization layer. Plastic deformation can be generated in such flexible materials during a cleaving process. In such a case, flexible materials may overlap the lasing region of the device, and thus block or scatter the light such that the desired function cannot be obtained.

SUMMARY OF THE INVENTION

It is an object of the present invention to provide a semiconductor laser diode having a stable self-aligned structure and of which an ohmic contact is a three-dimensional contact and which has an improved structure having excellent heat emitting capability.

It is another object of the present invention to provide a manufacturing method suitable for obtaining the above semiconductor laser diode.

To accomplish the above object, there is provided a method for manufacturing a laser diode comprising the steps of:

forming a multiple epitaxy layer including an activation layer on a semiconductor substrate;

forming a ridge on a top surface of the epitaxy layer;

depositing a passivation layer having a predetermined thickness on the epitaxy layer and the ridge thereon;

depositing a photoresist on the passivation layer;

exposing the entire photoresist on the top surface of the ridge or the entire photoresist on the top surface of the ridge and the photoresist of side surface of the ridge perpendicular to the top surface of the ridge to a predetermined depth;

removing the exposed portion of the photoresist thereby forming an opening portion therein;

removing the exposed passivation layer via the opening portion of the photoresist;

removing the photoresist remaining on both sides of the ridge; and forming a current injection layer over the resultant structure.

If the passivation layer of the above-described structure is made of $Al_2O_3$ or ZnSe, a more desirable effect can be obtained.

BRIEF DESCRIPTION OF THE DRAWINGS

The above objects and other advantages of the present invention will become more apparent by describing in detail a preferred embodiment thereof with reference to the attached drawings in which:

FIG. 6A to FIG. 6L illustrate the manufacturing process of a laser diode according to an embodiment of the manufacturing method of the present invention;

FIG. 7A to FIG. 7F are SEM photographs showing the structure of the laser diode at various stages of the process of FIG. 6A–6L;

DETAILED DESCRIPTION OF THE INVENTION

The present invention will be explained in more detail with reference to the attached drawings.

Figure 1:
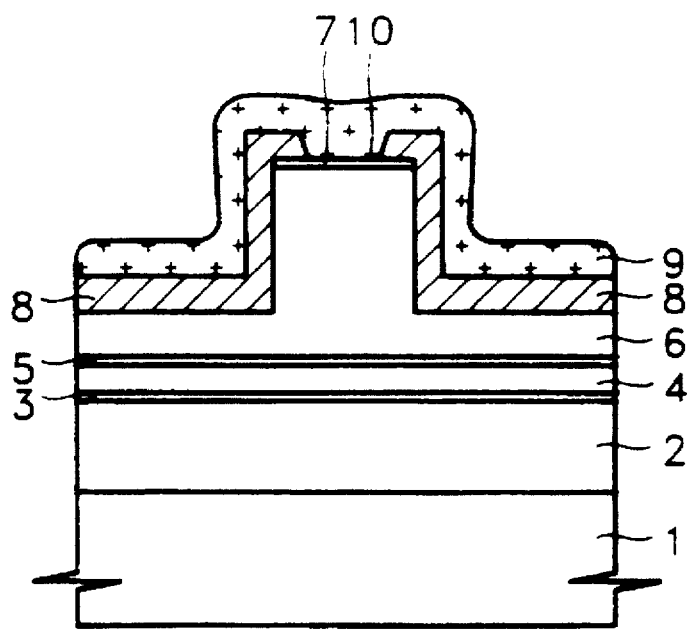
FIG. 1 is a section view showing a conventional ridge-type semiconductor laser diode.
Figure 2:
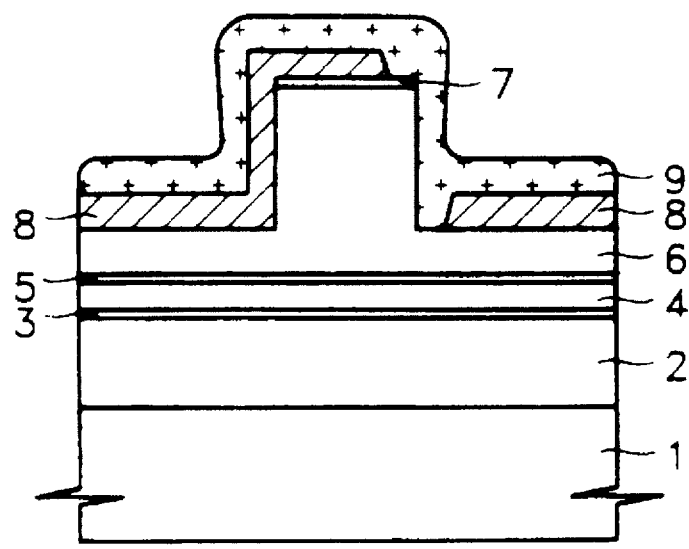
FIG. 2 is a section view showing the laser diode of FIG. 1 when misalignment occurs according to the conventional manufacturing method.
Figure 3A:
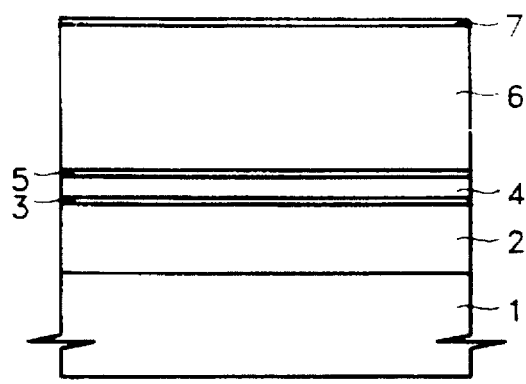
FIG. 3A to FIG. 3F illustrate the manufacturing process of the conventional laser diode.
Figure 3B:
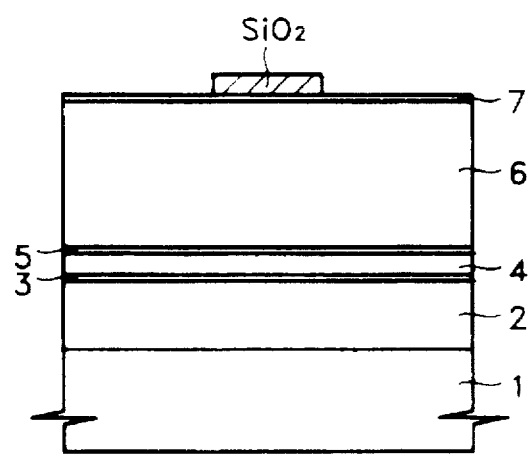
Figure 3C:
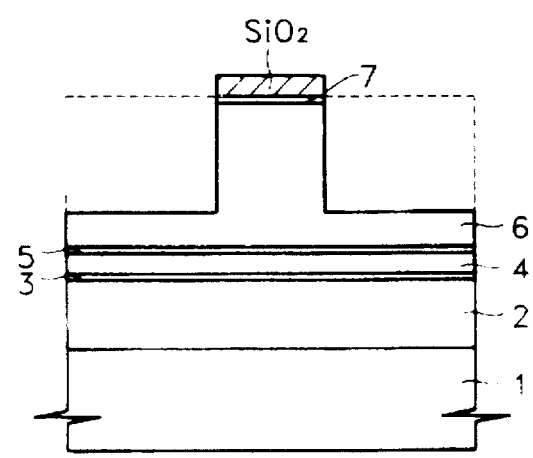
Figure 3D:
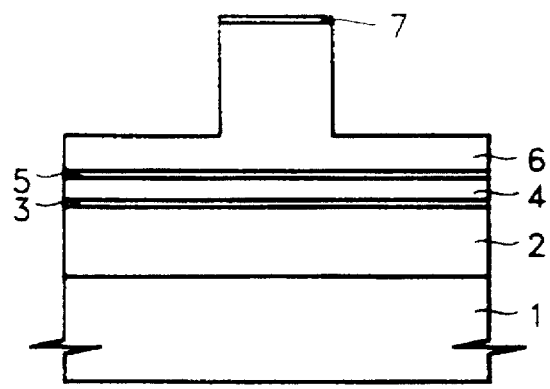
Figure 3E:
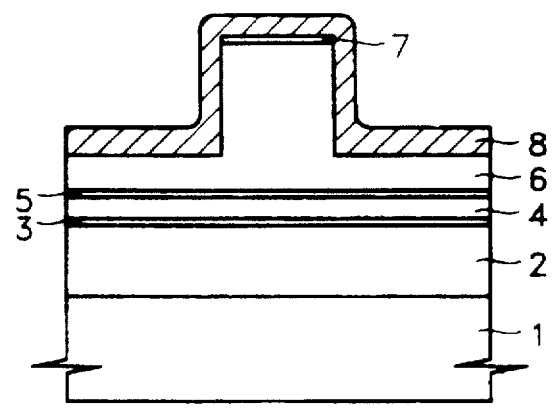
Figure 3F:
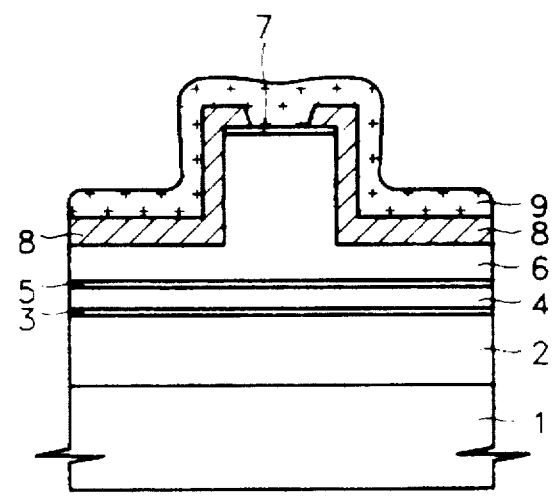
Figure 4A:
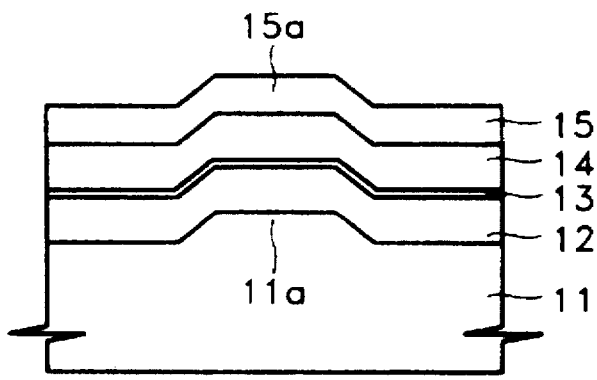
FIG. 4A to FIG. 4F illustrate the manufacturing process of another conventional laser diode.
Figure 4B:
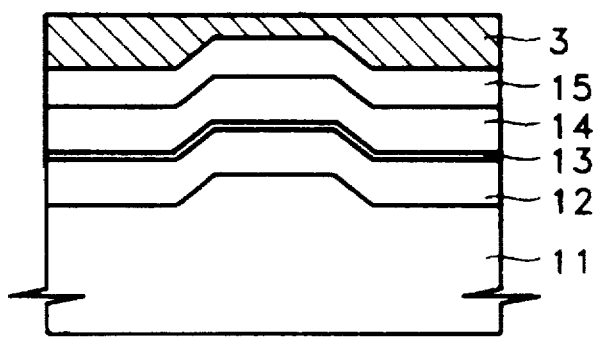
Figure 4C:
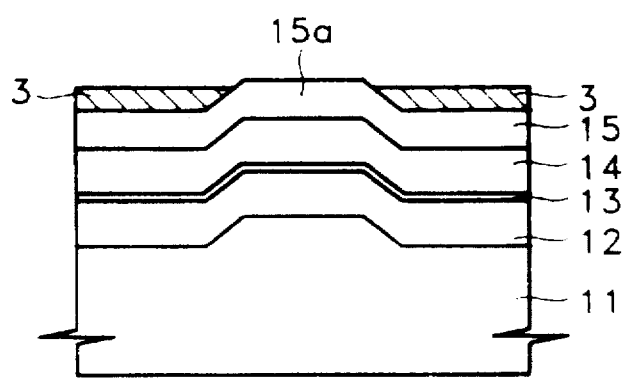
Figure 4D:
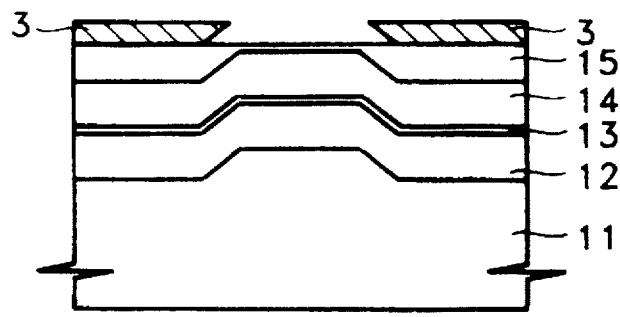
Figure 4E:
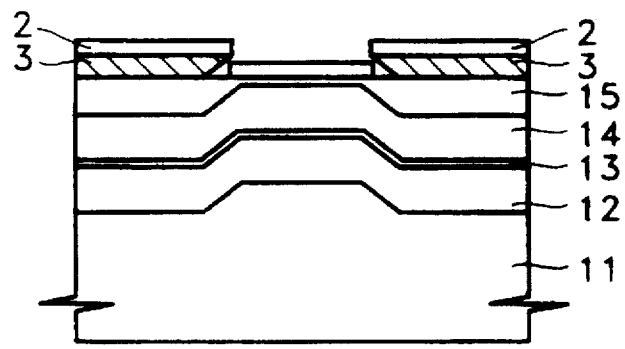
Figure 4F:
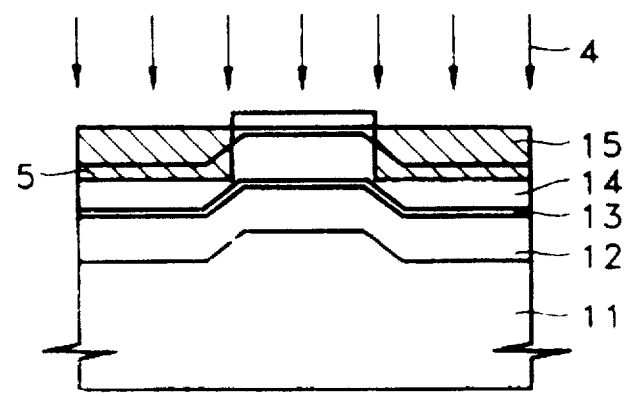
Figure 5A:
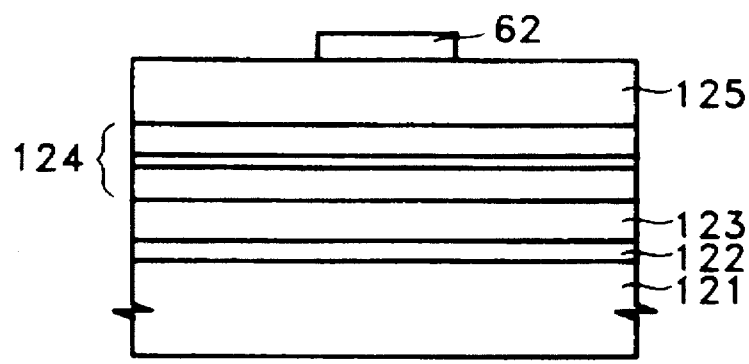
FIG. 5A to FIG. 5G illustrate the manufacturing process of still another conventional laser diode employing a conventional self-alignment technique.
Figure 5B:
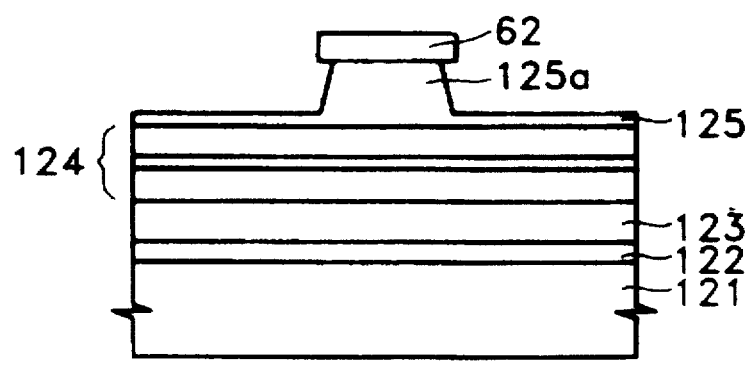
Figure 5C:
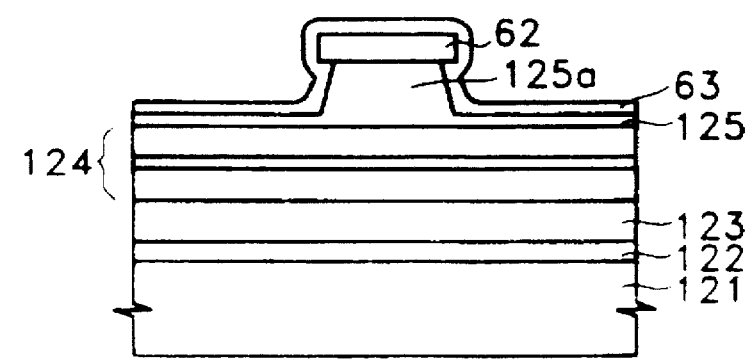
Figure 5D:
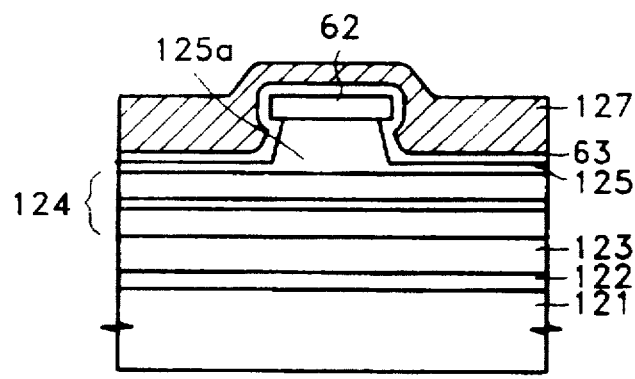
Figure 5E:
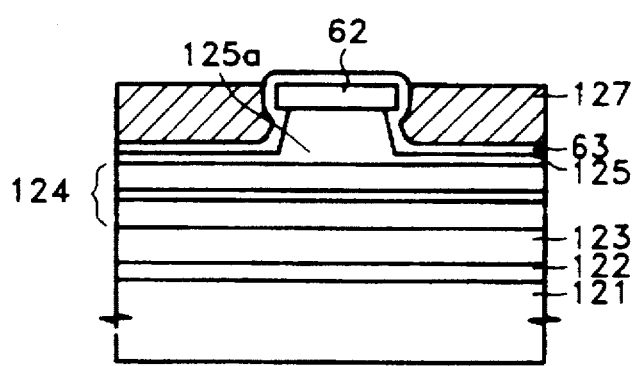
Figure 5F:
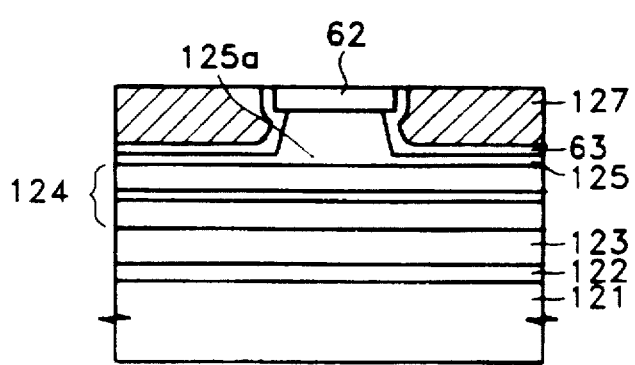
Figure 5G:
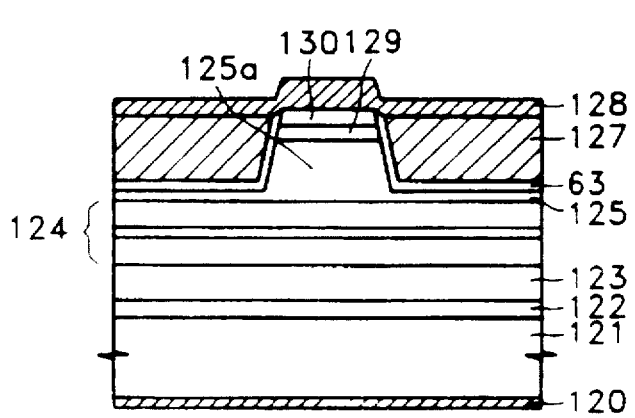
Figure 6A:
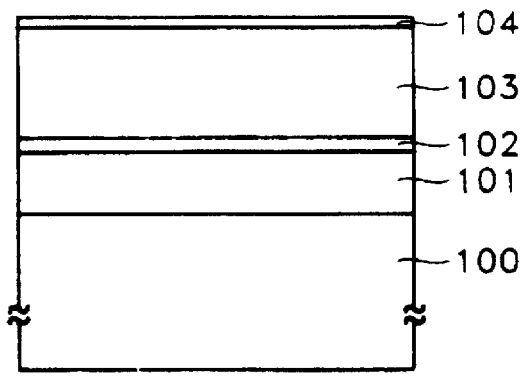
Figure 6B:
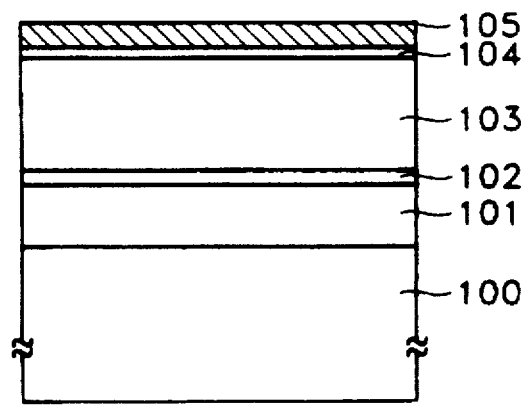
Figure 6C:
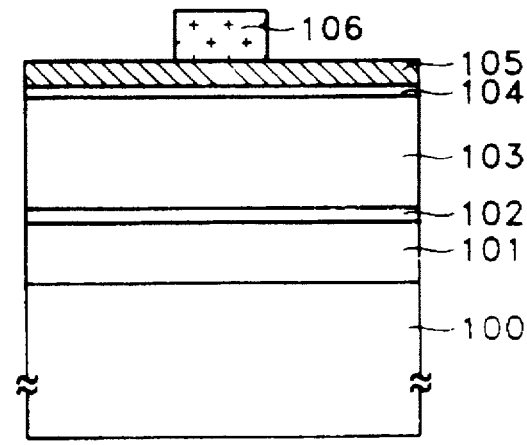
Figure 6D:
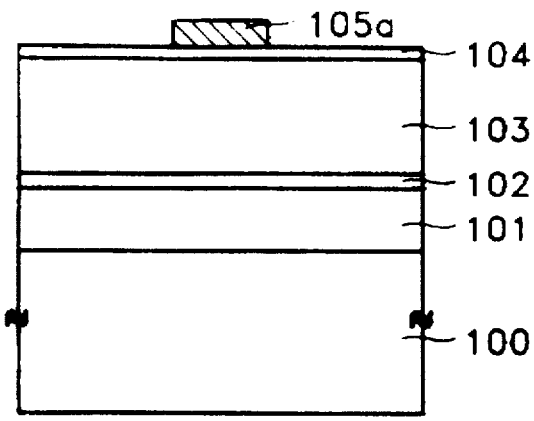
Figure 6E:
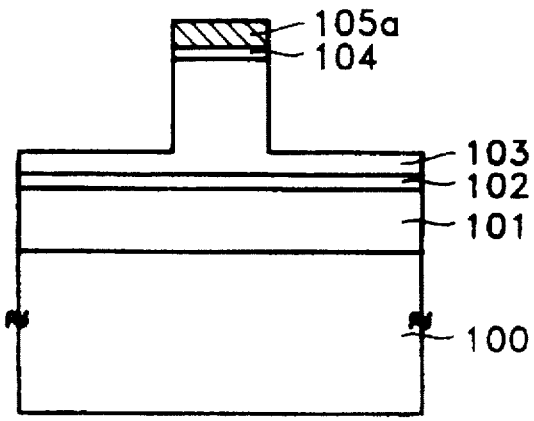
Figure 6F:
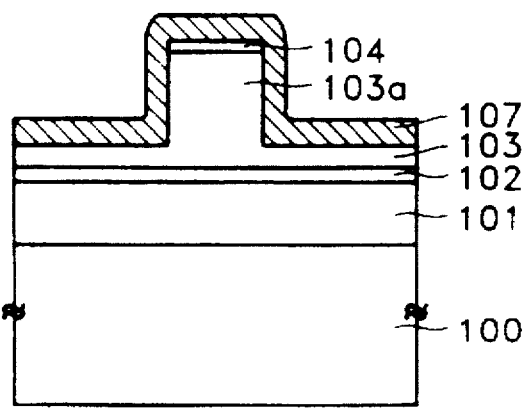
Figure 6J:
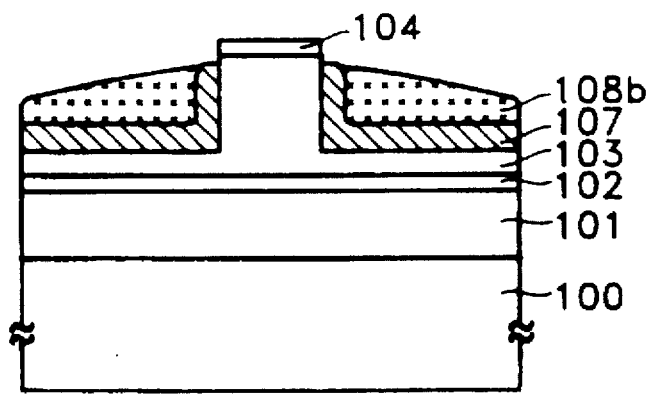
Figure 6K:
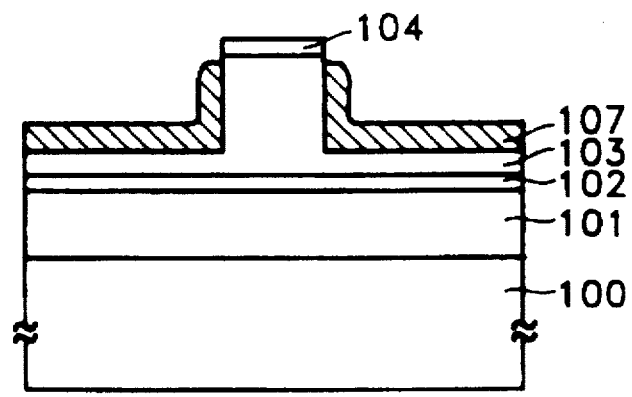
Figure 6L:
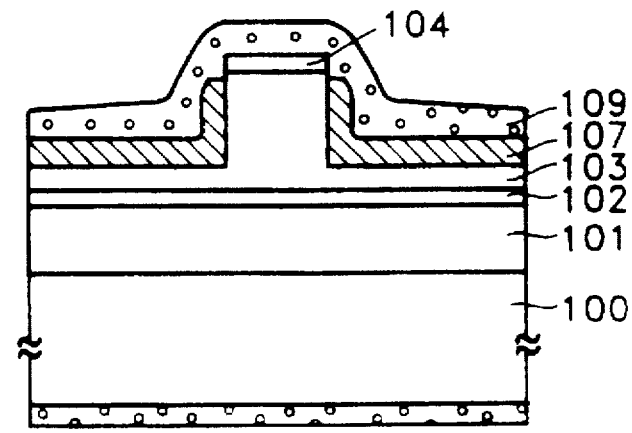

FIG. 6A to FIG. 6L illustrate the manufacturing process of a laser diode according to one embodiment of the manufacturing method of the present invention, especially, FIG. 6L is a schematic section view of the resulting laser diode obtained using the method of the present invention.

Referring to FIG. 6L, the laser diode according to the present invention is constructed such that an $n^+$ $Ga_{0.6}Al_{0.4}As$ first cladding layer 101 having a thickness of 1 µm, an $n^+$ $Al_xGa_{1-x}As$ waveguide layer, a strained $GaAs/In_{0.2}Ga_{0.8}As$ quantum-well-structure activation layer, a laser oscillating layer 102, i.e., a deposition structure of a $p^-$ $Al_xGa_{1-x}As$ second waveguide layer, a $p^+$ $Ga_{0.6}Al_{0.4}As$ second cladding layer 103, a $p^+$ GaAs cap layer 104, a passivation layer 107 of $SiO_2$ having a thickness of 300 nm, and a metal (CrPtAu) electrode layer 109 are sequentially formed on an $n^+$ GaAs semiconductor substrate 100.

The method for manufacturing such a laser diode is as follows.

As shown in FIG. 6A, first cladding layer 101, laser oscillating layer 102, second cladding layer 103 and cap layer 104 are sequentially deposited on the substrate 100 which is grown by a gas-source MBE method, employing general deposition methods such as chemical vapor deposition, MOCVD, VPE, MBE and liquid phase epitaxy (LPE). In the structure, any optional layer can be added and the structure can be modified depending on any required purpose. Then, as shown in FIG. 6B, $SiO_2$ layer 105 is deposited via a general deposition method on the upper surface of cap layer 104, i.e., the uppermost layer.

As shown in FIG. 6C, a photoresist is deposited on the $SiO_2$ layer, and then, using a general photolithography process, a photoresist mask 106 is formed for making a ridge via succeeding steps.

As shown in FIG. 6D, the uncovered portion of $SiO_2$ layer 105 with photoresist mask 106 is etched, and then photoresist mask 106 is removed. Thus, an $SiO_2$ mask 105a which will be used for a dry etching process is obtained. Here, a metal may be employed instead of $SiO_2$.

As shown in FIG. 6E, an epitaxy layer structure of the portion excluding the portion covered with the $SiO_2$ mask is etched via a dry etching with $CH_4/H_2$ gas, for example, the RIE process. Thus, a ridge 103a whose dimensions are, for example, 3 µm wide and 2 µm high, can be formed on second cladding layer 103.

As shown in FIG. 6F, the $SiO_2$ mask 105a is removed, and passivation layer 107 consisting of a material having a high electrical resistance, for example, $SiO_2$, $Al_2O_3$ or ZnSe, is deposited over the entire substrate, to thereby prepare the basic form of the laser diode having a ridge.

The process thus far is widely known. The following steps are characteristic of the present invention.

As shown in FIG. 6G, a photoresist 108 is deposited on the entire surface of second cladding layer 103 and ridge 103a on the substrate using a spin coater. Thus, photoresist thickness d1 above the ridge is thinner than photoresist thickness d2 beside the ridge.

As shown in FIG. 6H, a flood exposure is performed perpendicularly to photoresist 108 whose thickness varies, for a predetermined minimum time such that photoresist 108 located in top end surface of ridge 103a can be completely exposed. Here, the exposure time or light strength is controlled so that the exposure depth can be regulated. Then, the portion of photoresist 108a positioned on the top surface of the ridge and both upper portions of photoresist 108a positioned on the side wall of the ridge are exposed.

As shown in FIG. 6I, the exposed photoresist 108a is removed, so that a portion of passivation layer 107a is exposed, i.e., the portion over ridge 103a, to the extent of the photoresist exposure depth.

As shown in FIG. 6J, the exposed center portion of 107 is etched by a buffered oxide etching method or RIE etching method, to thereby remove the portion located on top end surface of the ridge.

As shown in FIG. 6K, remaining photoresist 108b is removed such that whole surface of passivation layer 107 is exposed.

As shown in FIG. 6L, a Cr/Pt/Au metal layer is deposited finally so as to provide current injection layer 109, and n-AuGe/Ni/Au metal layer is deposited on the bottom surface of GaAs substrate 100 thereby complete a laser diode.

In the above-described process, a photoresist having a viscosity of 18 cSt (Shipely Microposit S1400-27) is used in a photoresist spin coating method. Thickness d1 is approximately 0.2 µm and thickness d2 is approximately 1.2 µm when the spin speed of the spin coater is 6,000 rpm and the height of the ridge is 2.0 µm. Since the ridge is a protruding structure, when the photoresist deposition is flowed, the photoresist thickness above the ridge is always thinner than that at the sides.

In the above-described flood exposure process, if the direction perpendicular to the RIE etching surface of both sides of the ridge is regarded as a depth direction, the exposure depth ranges from the degree where at least the passivation layer on the ridge is completely removed by an etching process to the degree where the photoresist of the side wall of the ridge is exposed to a considerable depth so that the photoresist remains partially on the RIE etching surface. A heat emission can be performed more easily when the exposure depth is deeper as much as possible within the above-described scope.

The RIE etching method has a merit that an etching depth can be controlled correctly. However, a device may be damaged by a strong energy generated by ion collision. Therefore, a buffered oxide etching method is more desirable. FIG. 7A is an SEM photo showing the sectional structure of the laser diode after the process illustrated in FIG. 6G is performed, and shows that the photoresist thickness d1 is more thin that photoresist thickness d2.

Figure 7C:
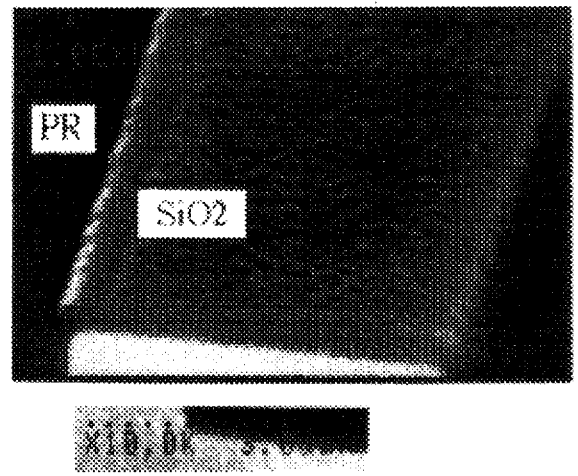

FIG. 7B is an SEM photo showing the sectional structure of the laser diode after the process illustrated in FIG. 6I is performed, and FIG. 7C is an SEM photo showing the laser diode structure in three dimensions after the process illustrated in FIG. 6I is performed and shows the exposed $SiO_2$ layer which will be etched by removing the photoresist after the exposure.

Figure 7D:
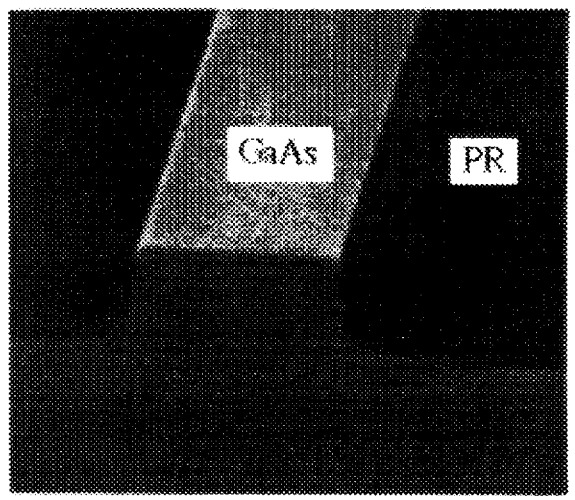

FIG. 7D is an SEM photo showing the sectional structure of the laser diode after the process illustrated in FIG. 6J is performed, and shows the GaAs which is exposed after the $SiO_2$ is etched.

Figure 7E:
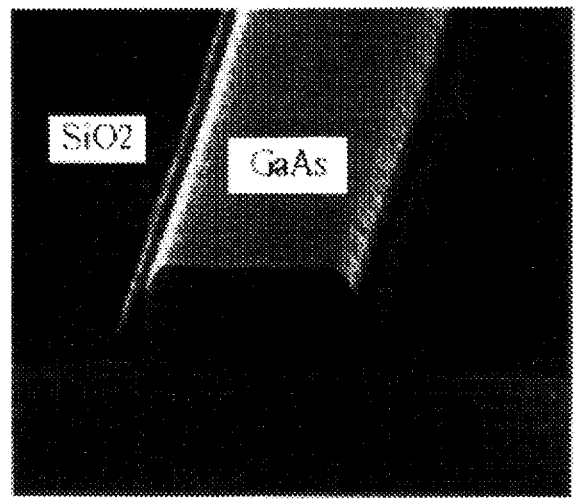

FIG. 7E is an SEM photo showing the sectional structure of the laser diode after the process illustrated in FIG. 6L is performed, and FIG. 7F is an SEM photo showing the laser diode structure in three dimensions after the process illustrated in FIG. 6L is performed. The remaining photoresist is removed, and the GaAs that exists in the entire top end surface of the ridge and partially in the ridge wall is exposed. Thus, a resistant contact surface is generated by a self-alignment.

Meanwhile, as an embodiment different from the above-described method, there is a method constituting a ridge on the substrate.

A substrate is etched so as to form a ridge. An epitaxy layer including an activation layer is deposited on the resultant structure while maintaining the ridge structure. Then, a passivation layer having a predetermined thickness is deposited; a photoresist is deposited on the passivation layer; the entire portion of the photoresist overlapping the top end surface of the ridge or the upper portion of the photoresist deposited on the sidewall surface of the ridge and the entire portion of the photoresist overlapping the top surface of the ridge are exposed; the exposed portion of the photoresist is removed; the exposed passivation layer is removed; the photoresist remaining on both sides of the ridge is removed; and a current injection layer is formed on the top surface of the resultant structure.

The laser diode manufactured according to the above method comprises an $n^+$ GaAs semiconductor substrate, an $n^+$ $Ga_{0.6}Al_{0.4}As$ first cladding layer having a thickness of 1 μm, an $n^+$ $Al_xGa_{1-x}As$ waveguide layer, a strained GaAs/$In_{0.2}Ga_{0.8}As$ quantum-well-structured activation layer, $p^-$ $Al_xGa_{1-x}As$ second waveguide layer, a $p^+$ $Ga_{0.6}Al_{0.4}As$ second cladding layer having a thickness of 1 μm, a passivation layer consisting of 300 nm of $SiO_2$, a $p^+$ type GaAs cap layer and a metal electrode layer consisting of CrPtAu.

The difference between embodiment 2 and embodiment 1 is as follows. In embodiment 1, plane epitaxy layers are formed on a substrate and a ridge is generated via an etching process. However, in embodiment 2, a semiconductor substrate is etched so as to obtain epitaxy layers with a ridge, and then, epitaxy formed through succeeding step layers are formed thereon. Accordingly, there is no difference between embodiment 1 and embodiment 2 except that, in embodiment 2, a process for forming a ridge is not required after the epitaxy layer is grown. In addition, thickness of each layer, doping type and function are the same as those of embodiment 1.

Figure 8:
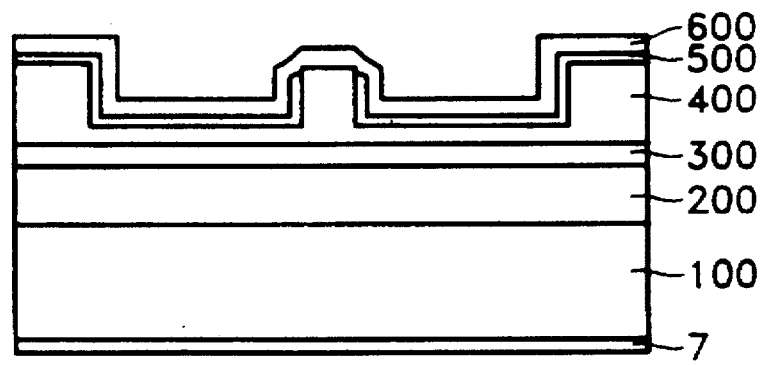
FIG. 8 shows the sectional structure of a laser diode manufactured according to another embodiment of the present invention.

FIG. 8 shows the sectional structure of the laser diode manufactured by embodiment 3 of the present invention.

On a substrate of which bottom surface is provided with a lower electrode 700, upper and lower cladding layers 200 and 400 are deposited putting an activation layer 300 between layers 200 and 400. Upper cladding layer 400 has two channels formed therein. Passivation layer 500 is formed on the protrusions and the channel and not on the top surface of the ridge, and a current injection layer 600 is formed on passivation layer 500.

The method for manufacturing such a double channel ridge-type laser diode comprises the steps of: forming a multiple epitaxy layer including an activation layer onto a substrate; forming a double channel ridge on a top surface of the multiple epitaxy layer; depositing a passivation layer having a predetermined thickness on the epitaxy layer; depositing a photoresist on the passivation layer; exposing the entire photoresist on the top surface of the ridge or the upper portion of the photoresist that exists in wall surface of the ridge and the entire photoresist on the top end surface of the ridge at the direction perpendicular to the top surface of the ridge to a predetermined depth, while maintaining the peripheral region of the protrusion that exists in an outer portion of the both channels not to be exposed; removing the exposed portion of the photoresist; removing the exposed passivation layer; removing the photoresist remaining in both sides of the ridge; and forming a current injection layer in the top end surface of the structure.

In the above embodiment, the process is same as the general one except for the formation of the double channel structure. The method for forming the double-channel laser diode is as follows.

Figure 9A:
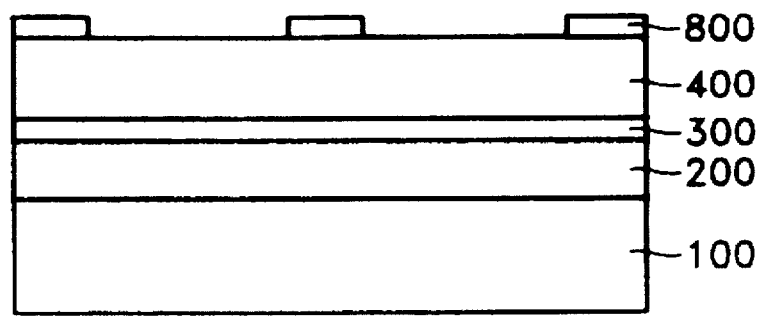
FIG. 9A to FIG. 9G illustrate the manufacturing process according to the embodiment of FIG. 8.

As shown in FIG. 9A, a lower cladding layer 200, an activation layer 300 and an upper cladding layer 400 are formed on a GaAs substrate 100 by general deposition methods such as VPE, MOCVD, MBE, LPE and sputtering. The deposited layers can be added or modified depending on any desirable purposes. Then, $SiO_2$ is deposited on the resultant structure, and an $SiO_2$ mask 800 required for forming the double channel is formed by the general patterning method.

Figure 9B:
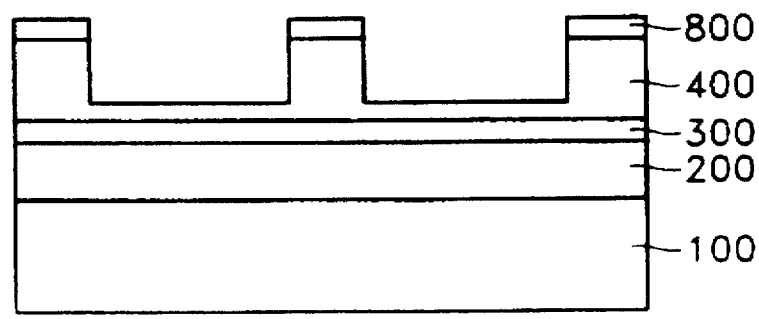

As shown in FIG. 9B, the exposed portion of upper cladding layer 400 is etched to a predetermined depth by an RIE method, and the double-channel structure is formed on upper cladding layer 400.

Figure 9C:
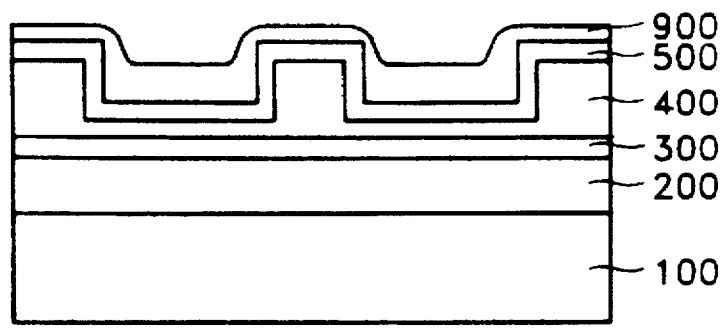

As shown in FIG. 9C, $SiO_2$ mask 800 is removed, and $SiO_2$ layer 500, i.e., the current blocking layer, is deposited thereon. Then, a photoresist 900 is deposited by a general spin coater.

The ridge and the photoresist around the ridge are exposed to a predetermined depth perpendicular to the top surface of the ridge while preventing the exposure of the protrusion portion of both ends of the channel, by using a wide strip open mask where the width of the opening is restricted in the central ridge and part of the peripheral region of the ridge.

Figure 9D:
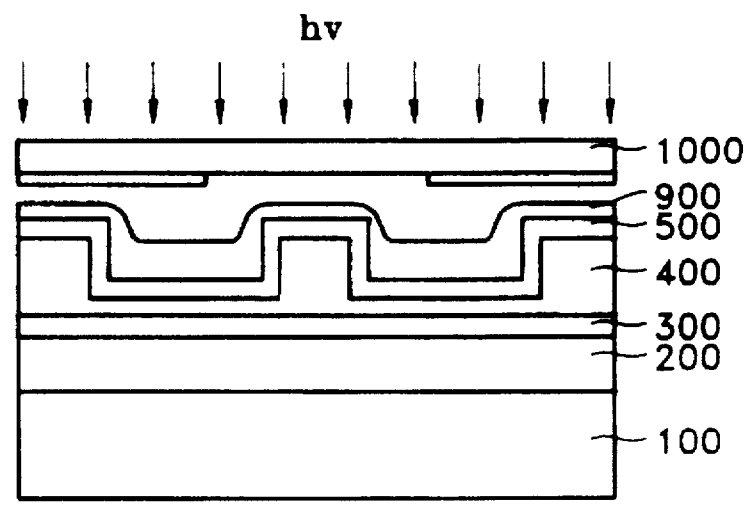

As shown in FIG. 9D, the exposed portion of the resist is removed.

Figure 9E:
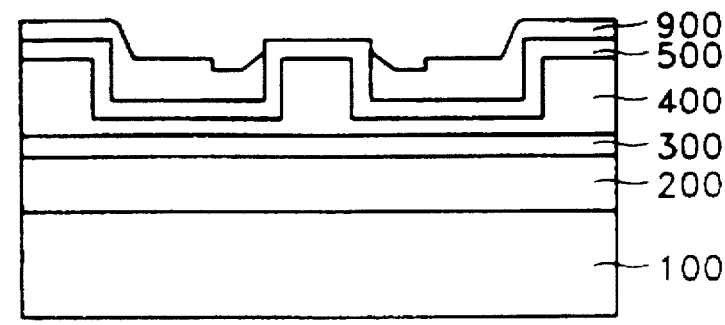

As shown in FIG. 9E, the exposed $SiO_2$ layer on the top surface of the ridge is etched.

Figure 9F:
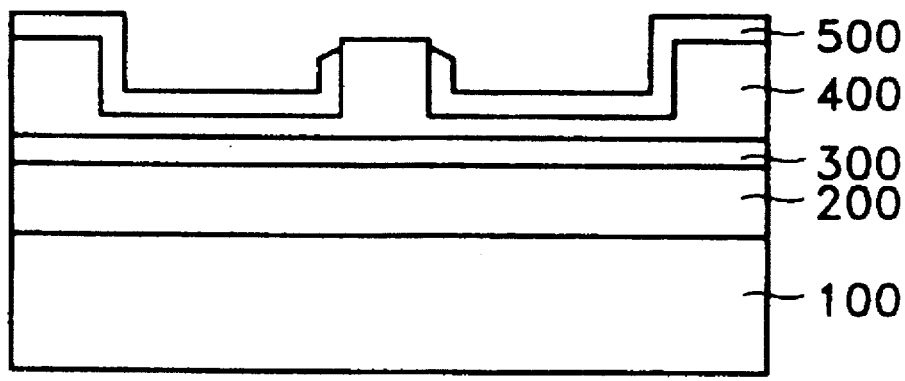

As shown in FIG. 9F, the remaining photoresist is removed.

Figure 9G:
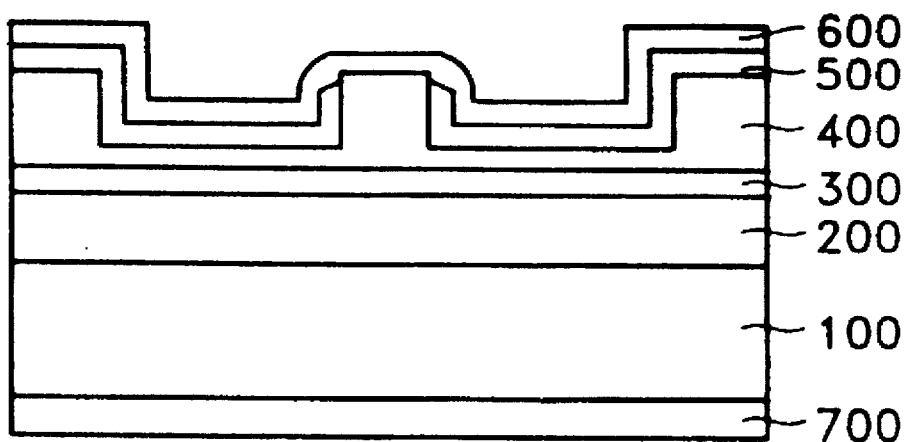

In addition, as shown in FIG. 9G, metal layer 600, i.e., the current injection layer, is formed in the top surface of the ridge and lower electrode 700 is formed in the bottom surface of the substrate, to thereby complete the process.

The characteristic of the embodiment of the present invention is that a resistant contact surface formed by self-alignment is applied to a double-channel structure. Here, the strip mask for a patterning process is wide, that is, above 50 μm, which prevents misalignment.

As described above, it is the merit of the present invention that a micro-alignment process is not necessary in forming the resistant contact surface. In addition, a laser diode having low resistance and excellent heat emission effects can be manufactured by extending the resistant contact surface three-dimensionally to include the whole top surface and part of the side surface of the ridge. Further, the above structure has no planarization layer, which enables more effective heat emission.

A ridge-type laser diode having an excellent heat emission effect can be manufactured according to the present invention, and yield can be greatly improved due to the simplicity. Since heat emission and alignment are very important laser diode features, the present invention has a significantly enhanced effect in manufacturing.

What is claimed is:

1. A ridge-type laser diode comprising:

an epitaxy layer including an activation layer;

a ridge formed on said epitaxy layer, said ridge having a top surface and a wall portion;

a passivation layer formed on said ridge, said passivation layer stopping below said top surface of said ridge while maintaining said ridge structure; and a current injection layer formed on the ridge while maintaining said ridge structure, wherein the contact surface between said current injection layer and said epitaxy layer ranges from the top surface to the wall portion of the ridge.

2. A ridge-type laser diode according to claim 1, wherein said passivation layer is formed of a component selected from the group consisting of $Al_2O_3$ and ZnSe.

3. A ridge-type laser diode comprising:

an epitaxy layer including an activation layer;

a ridge formed on said epitaxy layer, said ridge having a top surface and a wall portion;

channels formed on both sides of said ridge;

a passivation layer formed on said ridge, said passivation layer stopping below said top surface of said ridge while maintaining said ridge structure; and a current injection layer formed on the ridge while maintaining said ridge structure, wherein the contact surface between said current injection layer and said epitaxy layer ranges from the top surface to the wall portion of the ridge.

4. A ridge-type laser diode according to claim 3, wherein said passivation layer is formed of a component selected from the group consisting of $Al_2O_3$ and ZnSe.

* * * * *

UNITED STATES PATENT AND TRADEMARK OFFICE
CERTIFICATE OF CORRECTION

PATENT NO. : 5,640,410
DATED : June 17, 1997
INVENTOR(S) : Seung-kee Yang

It is certified that error appears in the above-indentified patent and that said Letters Patent is hereby corrected as shown below:

Col. 6, line 13, delete the comma; Col. 6, line 15, after "100" insert -- , to --.

Signed and Sealed this

Seventh Day of October, 1997

Attest:

BRUCE LEHMAN

Attesting Officer

Commissioner of Patents and Trademarks